United States Patent [19]

Fehiner et al.

[11] 4,002,545
[45] Jan. 11, 1977

[54] METHOD OF FORMING A THIN FILM CAPACITOR

[75] Inventors: Francis P. Fehiner, Corning; Arthur J. Whitman, Elmira; Peter L. Young, Horseheads, all of N.Y.

[73] Assignee: Corning Glass Works, Corning, N.Y.

[22] Filed: Feb. 9, 1976

[21] Appl. No.: 656,526

[52] U.S. Cl. .............................. 204/192; 29/25.42; 29/570; 317/258

[51] Int. Cl.² .................... C23C 15/00; H01G 7/00

[58] Field of Search .......... 204/192; 29/25.42, 570; 317/258

[56] References Cited

UNITED STATES PATENTS 3,257,305   6/1966   Varga ................................ 204/192
3,969,197   7/1976   Tolar et al. ........................ 204/15

OTHER PUBLICATIONS

Maissel et al, "Handbook of Thin Film Technology," McGraw Hill, 1970, pp. 19-30.
P. Lloyd, "Thin–Film Capacitors Using Tantalum Oxide Dielectrics Prepared by Reactive Sputtering", *Solid State Electronics*, July 1961, pp. 74–75.

*Primary Examiner*—John H. Mack
*Assistant Examiner*—Aaron Weisstuch
*Attorney, Agent, or Firm*—Walter S. Zebrowski; Clarence R. Patty, Jr.

[57] ABSTRACT

A method of forming a thin film capacitor having a tantalum oxide dielectric is described. A dielectric substrate having formed thereon a duplex electrically conductive film comprising a non-tantalum electrically conductive film electrode covered by a thin tantalum conductive film is disposed within an oxygen-inert gas containing vacuum environment, said non-tantalum film being disposed intermediate said substrate and said tantalum film. A film of tantalum oxide is applied over the conductive film by r-f sputtering of a tantalum oxide target within the oxygen-inert gas containing vacuum environment while the dielectric substrate and conductive film are being cooled. The composite may then be removed from said oxygen-inert gas containing environment and a second electrically conductive film electrode applied over the so-formed tantalum oxide film.

10 Claims, 4 Drawing Figures

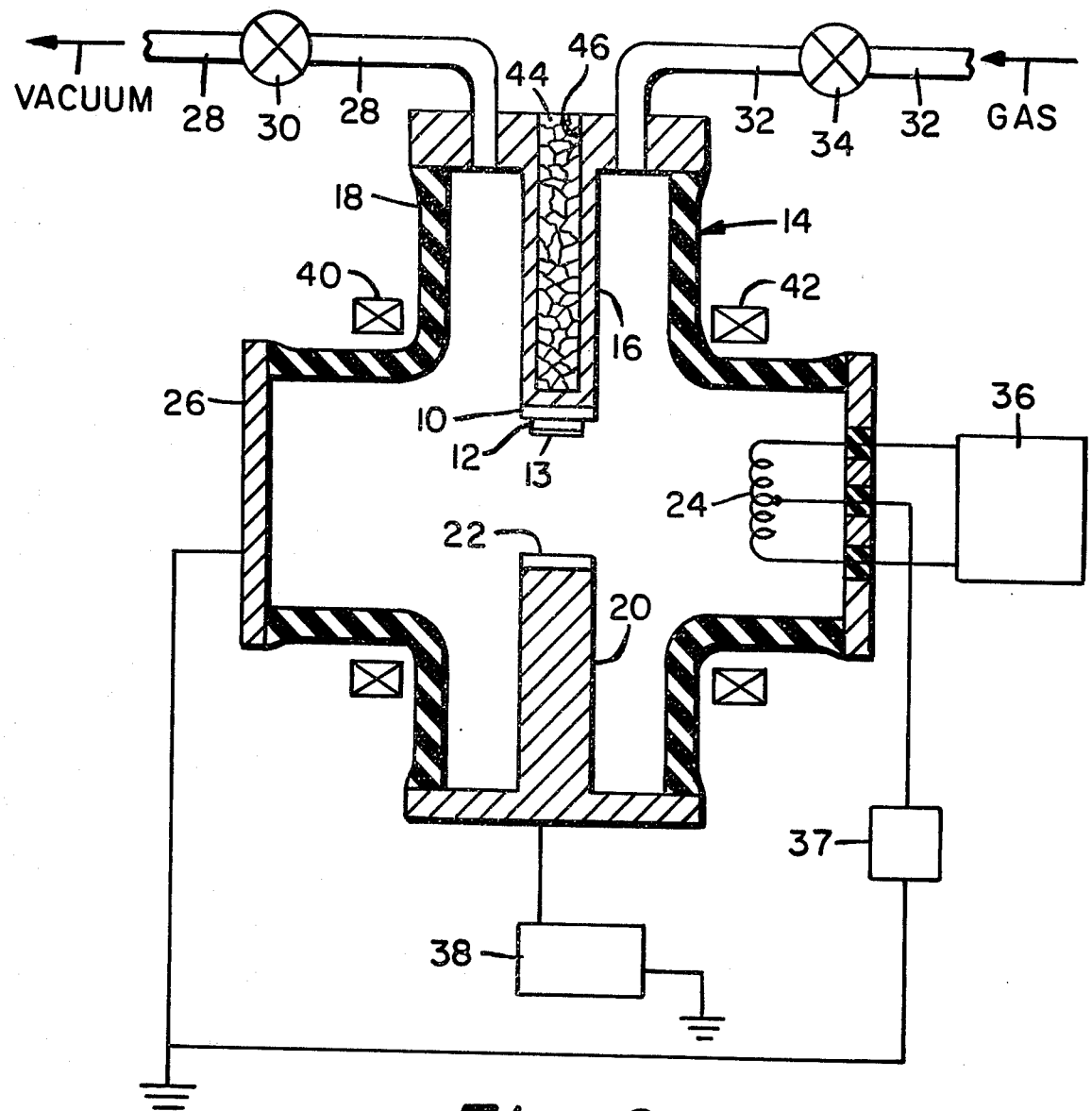
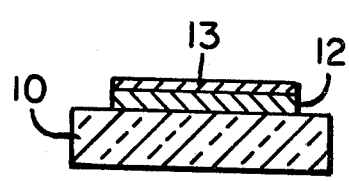
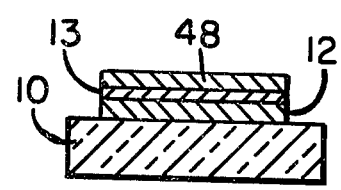
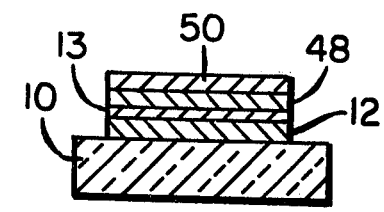
Fig. 2
Fig. 1   Fig. 3   Fig. 4

METHOD OF FORMING A THIN FILM CAPACITOR

BACKGROUND OF THE INVENTION

1. Field of the Invention

The present invention relates to a method of forming a thin film capacitor having a tantalum oxide dielectric.

2. Description of the Prior Art

In the manufacture of thin film capacitors, it has heretofore been necessary to first form a thin film of tantalum as the first electrode on a dielectric substrate. This composite would then be placed in an anodizing bath to form a layer of tantalum oxide on the tantalum film, which procedure required an abnormally long period of time, thereby adding greatly to the cost of manufacturing a capacitor. Further, in the past, when a definite capacitor pattern was required, complicated and time consuming photolithographic, or like techniques were required to produce well defined edges to reduce edge effect problems.

SUMMARY OF THE INVENTION

An object of this invention is to provide a method of fabricating a capacitor which can readily provide any desired capacitor pattern.

Further objects of this invention are to provide a vacuum method for forming a thin $Ta_2O_5$ film capacitor which is economical, does not produce a significant decrease in the value of breakdown voltage, reduces the time of fabrication, and one which overcomes the heretofore noted disadvantages.

Broadly, according to the present invention, a suitable dielectric substrate is provided, to which is applied a non-tantalum electrically conductive film electrode covered by a thin tantalum film. The substrate and duplex conductive film is then disposed within an oxygen-inert gas containing vacuum environment and a film of tantalum oxide of desired thickness is sputtered by r-f sputtering techniques over the duplex conductive film within the oxygen-inert gas containing vacuum environment while the dielectric substrate and conductive film are being cooled. The composite so formed may then be removed from said environment and a non-tantalum electrically conductive film counter electrode applied over the dielectric film.

Additional objects, features, and advantages of the present invention will become apparent to those skilled in the art from the following detailed description and the attached drawing on which, by way of example, only the preferred embodiment of this invention is illustrated.

BRIEF DESCRIPTION OF THE DRAWING

FIG. 1 is a cross-sectional view of a dielectric substrate with an electrically conductive duplex film applied thereto.

FIG. 2 is a diagrammatic cross-sectional view of an r-f sputtering apparatus suitable for use in the method of the present invention.

FIG. 3 is a cross-sectional view of the composite of FIG. 1 over which duplex film a dielectric film has been applied.

FIG. 4 is a cross-sectional view illustrating a capacitor formed by the present method.

DETAILED DESCRIPTION OF THE DRAWING

It is to be noted that the drawings are illustrative and symbolic of the invention, and there is no intention to indicate scale or relative proportions of the elements shown therein. For the purpose of simplicity, the present invention will be described in connection with the formation of a tantalum oxide film suitable for use as a dielectric in a capacitor.

Referring to FIG. 1 of the drawing, there is shown a dielectric substrate 10 to which is applied a duplex film including a non-tantalum electrically conductive film electrode 12 covered by a thin tantalum film 13. The material of dielectric substrate 10 may be any suitable dielectric material such as glass, ceramic, glass-ceramics, or the like. The material of electrode 12 may be any electrically conductive material which is compatible with tantalum and tantalum oxide as well as compatible with the method of applying a film of tantalum oxide thereto, such as for example aluminum, nichrome, chromium, gold, or the like. A suitable thickness for tantalum film 13 may range from about 150A to about 500A.

Referring also to FIG. 2, the composite so formed is disposed within a typical r-f sputtering apparatus 14. Apparatus 14 consists of a substrate holder 16 attached to one opening of apparatus housing 18. Adjacent and opposite to substrate holder 16 is target holder 20 attached to housing 18 at another opening therein. Target material 22 is disposed on holder 20 and is generally held in place by gravity, whereas substrate 10 and electrode 12 are disposed on substrate holder 16 and generally held in place by peripheral or exterior means such as clamps, or the like, not shown.

A filament cathode 24 is disposed within housing 18 while anode 26 is disposed over still another opening in housing 18. A vacuum pump, not shown, or other vacuum means is connectable to housing 18 by means of conduit 28 through control valve 30. A source of inert ionizable gas and oxygen, not shown, is also connectable to apparatus housing 18 through conduit 32 and control valve 34. Electron producing filament cathode 24 is connected to a suitable dc power source 36 while anode 26 is illustrated connected to filament cathode 24 through a suitable dc power source 37. Target holder 20 is connected to a suitable r-f power source 38. A pair of magnetic coils 40 and 42 are disposed about the exterior of apparatus housing 18 and are also connected to a suitable source of electrical energy, not shown. A suitable quantity of coolant 44 is disposed within cavity 46 of substrate holder 16.

The dielectric substrate-duplex film composite of FIG. 1 is disposed on substrate holder 16 while a target of tantalum oxide 22 is disposed on target holder 20 within housing 18. Housing 18 is then sealed and a predetermined desired vacuum is drawn therein. The amount of vacuum drawn depends on the materials involved in the sputtering as well as, to some extent, on the electrical parameters of the various parts of the apparatus. A quantity of a mixture of an inert ionizable gas and oxygen is then introduced into housing 18, reducing the vacuum to a predetermined desired level. One familiar with the art can readily select a suitable level of vacuum for a specific set of parameters. For the purposes of the present invention a range of oxygen-inert gas mixture ratios ranging from about 2 percent to about 10 percent by volume of oxygen is suitable. The ionizable gas may be any suitable inert ionizable gas such as argon, xenon, krypton, or the like. A plasma is then initiated by means of filament cathode 24, anode 26, and dc power sources 36 and 37 while suitable r-f energy is applied to target material 22 by r-f power source 38. A quantity of coolant 44, such as dry ice, for example, is disposed within cavity 46 of substrate holder 16. Any coolant at a temperature of about −70° C or lower is suitable for the present invention. If desired, magnetic coils 40 and 42 may be energized to focus the plasma. Under these described conditions, target material 22 will be caused to sputter and be applied over film 13 and electrode 12 on substrate 10. When desired, a mask may be interposed over film 13 and electrode 12 to pattern the application of the target material on film 13 and electrode 12. Such a mask is not shown; however, its nature will be readily understood by one familiar with the art. After a suitable time period of sputtering, a layer or film 48 of target material 22 will be applied to film 13 and electrode 12 as illustrated in FIG. 3. As heretofore described, the target material for thin film capacitors will be tantalum oxide, $Ta_2O_5$, which will comprise the capacitor dielectric. In the ordinary formation of a $Ta_2O_5$ film by r-f sputtering, the resulting film will be non-stoichiometric, that is it will be somewhat oxygen deficient. A capacitor formed with such a non-stoichiometric dielectric film will have high leakage current, low breakdown voltage, and will be very lossy, that is, it will have a high loss tangent. A description of such problems is set out in copending application entitled "Thin Film Capacitor and Method"; Ser. No. 656,525 filed by P. L. Young on even date herewith, which application is expressly incorporated herein by reference. It has been found that sputtering $Ta_2O_5$ in an oxygen containing vacuum environment cures the non-stoichiometric condition of layer 44, that is, the resulting $Ta_2O_5$ layer or film is significantly less oxygen deficient, whereupon the capacitor breakdown voltage is significantly increased while its leakage current and loss tangent are reduced. The capacitor may then be removed from the vacuum environment and a counter electrode 50 applied over dielectric film 48 as shown in FIG. 4. Counter electrode 50 may be applied within the vacuum environment if desired and if the equipment is adaptable to such application. Counter electrode 50 as well as electrode 12 and thin tantalum film 13 can be applied by any suitable method known in the art, such as for example, physical vapor deposition, electron beam evaporation, or the like. Material suitable for counter electrode 50 may be any electrically conductive material, which material and method of applying it does not deleteriously affect layer or film 48, such as for example gold, copper, silver, or the like.

A typical example of the present invention is as follows. A 3000A thick layer of aluminum was deposited on a glass substrate by physical vapor deposition to form the base electrode. A thin film of tantalum having a thickness of 350A was deposited over the base aluminum electrode by physical vapor deposition to form a duplex electrically conductive film. The base electrode and tantalum film each had an area of about 5.07 cm². The substrate-duplex film composite was placed in an r-f sputtering apparatus such as is illustrated in FIG. 2 and was attached to substrate holder 16 by means of suitable peripheral clamps. The duplex film was exposed to a tantalum oxide target disposed on a target holder adjacent and in opposition to the duplex film. The r-f sputtering apparatus was secured and a vacuum of about $10^{-6}$ Torr was drawn. A quantity of a mixture of oxygen and argon gas was then introduced into the apparatus until the vacuum environment reached $5 \times 10^{-3}$ Torr. The oxygen-inert gas mixture contained about 4% by volume of oxygen. A quantity of dry ice (solid $CO_2$) was placed in a cavity in the substrate holder to cool the substrate-duplex film composite during sputtering. A plasma was created between the target holder and the duplex film by both energizing the anode and filament dc power sources and by electrons which were emitted from the filament cathode and transmitted to the anode. The anode dc power source was energized to a voltage of 110 volts while the filament dc power source was energized to a voltage of about 20 volts. An r-f power source connected to the target holder and the tantalum oxide was energized, whereupon the tantalum oxide was at a voltage of −2000 volts to ground at a frequency of 3.68 mHz. Under these conditions, tantalum oxide was caused to be sputtered from the target to the surface of the duplex film until a layer of $Ta_2O_5$ having a thickness of 2300A and an area of 0.785 cm.² was deposited on the duplex film. The period of time required for sputtering such a thickness of tantalum oxide was about 17 minutes. The substrate-duplex film-tantalum oxide composite was allowed to warm up and the environment within the chamber was brought to atmospheric pressure by introducing nitrogen gas therein. The composite was removed from the sputtering apparatus and a counter electrode of gold was applied by physical vapor deposition onto the dielectric film of tantalum oxide. The resulting capacitor had a capacitance of 800 ufd. and a breakdown voltage of about 75 volts. Breakdown voltage is defined as that voltage necessary to produce a leakage current equal to or less than $10^{-9}$ amp for a 1000 pfd capacitor. The loss tangent at 1kHz was 0.35 percent and the leakage current at 45 volts was $2 \times 10^{-10}$ amp.

Although the present invention has been described with respect to details of certain embodiments thereof, it is not intended that such details be limitations upon the scope of the invention except insofar as set forth in the following claims.

We claim:

1. A method of forming a capacitor comprising the sequential steps of providing a dielectric substrate,
   applying to said dielectric substrate a non-tantalum electrically conductive film to form a first capacitor electrode,
   applying over said electrode a thin film of tantalum which together with said electrically conductive film forms a duplex film,
   disposing said substrate and said duplex film within a vacuum environment containing an oxygen-inert gas mixture,
   r-f sputtering a film of tantalum oxide of desired thickness over said duplex film within said vacuum environment, said tantalum oxide being sputtered from a tantalum oxide target,
   cooling said dielectric substrate and duplex film while said film of tantalum oxide is being sputtered thereon, and thereafter
   applying an electrically conductive film over said film of tantalum oxide to form a counter capacitor electrode.

2. The method of claim 1 wherein said oxygen and inert gas mixture comprises at least about 4 percent by volume of oxygen.

3. The method of claim 1 wherein said first capacitor electrode is formed of aluminum.

4. The method of claim 3 wherein said counter capacitor electrode is formed of gold.

5. The method of claim 1 wherein said vacuum environment has a pressure of about $5 \times 10^{-3}$ Torr or less.

6. The method of claim 4 wherein said oxygen and inert gas mixture comprises at least about 4 percent by volume of oxygen and said vacuum environment has a pressure of about $5 \times 10^{-3}$ Torr or less.

7. The method of claim 6 wherein at least one of said first electrode and counter electrode is applied by physical vapor deposition.

8. The method of claim 1 wherein said counter electrode is formed of a material selected from the group consisting of gold, copper, and silver.

9. The method of claim 1 wherein said duplex film and counter electrode are applied in a vacuum atmosphere.

10. The method of claim 1 wherein said oxygen and inert gas mixture comprises at least about 4 percent by volume of oxygen and said vacuum environment has a pressure of about $5 \times 10^{-3}$ Torr or less; said first capacitor electrode is formed of aluminum; said counter electrode is formed of a material selected from the group consisting of gold, copper and silver; and said first capacitor electrode, tantalum film and counter electrode are applied in a vacuum atmosphere.

* * * * *